(12) United States Patent
Guo et al.

(10) Patent No.: US 10,629,748 B2
(45) Date of Patent: Apr. 21, 2020

(54) SEMICONDUCTOR DEVICE HAVING A FERROELECTRIC MATERIAL LAYER

(71) Applicant: UNITED MICROELECTRONICS CORP., Hsin-Chu (TW)

(72) Inventors: Pengfei Guo, Singapore (SG); Shao-Hui Wu, Singapore (SG); Hai Biao Yao, Singapore (SG); Yu-Cheng Tung, Kaohsiung (TW); Yuanli Ding, Singapore (SG); Zhibiao Zhou, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/655,847

(22) Filed: Jul. 20, 2017

(65) Prior Publication Data

US 2018/0358475 A1    Dec. 13, 2018

(30) Foreign Application Priority Data

Jun. 7, 2017 (TW) .............................. 106118821 A

(51) Int. Cl.
*H01L 29/786* (2006.01)
*H01L 29/78* (2006.01)
*H01L 29/49* (2006.01)
*H01L 29/417* (2006.01)

(52) U.S. Cl.
CPC .. *H01L 29/78696* (2013.01); *H01L 29/41733* (2013.01); *H01L 29/4908* (2013.01); *H01L 29/7869* (2013.01); *H01L 29/78391* (2014.09); *H01L 29/78648* (2013.01)

(58) Field of Classification Search
CPC ............ H01L 29/78696; H01L 29/516; H01L 29/78391; H01L 29/6684; H01L 27/11585–27/11597; H01L 21/28291; H01L 29/78669; H01L 29/78648; G11C 11/223
See application file for complete search history.

(56) References Cited

U.S. PATENT DOCUMENTS

| 5,384,729 A * | 1/1995 | Sameshima ....... H01L 27/11502 257/295 |
| 6,335,550 B1 * | 1/2002 | Miyoshi ............ H01L 21/28291 257/288 |
| 2006/0081936 A1 * | 4/2006 | Kim .................... H01L 29/7831 257/365 |

(Continued)

OTHER PUBLICATIONS

Li, "Sub-60mV-Swing Negative-Capacitance FinFET without Hysteresis", Dec. 7, 2015.

(Continued)

*Primary Examiner* — Daniel Whalen
*Assistant Examiner* — Suberr L Chi
(74) *Attorney, Agent, or Firm* — Winston Hsu

(57) ABSTRACT

A semiconductor device includes a substrate, a source region and a drain region, a gate dielectric layer, and a ferroelectric material layer. The ferroelectric material layer overlaps with the source region and overlaps with the drain region. The substrate further comprises a channel layer. A gate electrode is disposed on the substrate. The ferroelectric material layer is disposed between the channel layer and the gate electrode.

15 Claims, 2 Drawing Sheets

(56) References Cited

U.S. PATENT DOCUMENTS

| | | | | |
|---|---|---|---|---|
| 2009/0173978 A1* | 7/2009 | Kato | .................... | G11C 11/22 257/295 |
| 2011/0316059 A1* | 12/2011 | Ahn | ................ | H01L 21/28291 257/295 |
| 2015/0014813 A1 | 1/2015 | Mueller | | |
| 2015/0295193 A1* | 10/2015 | Park | .................. | H01L 51/0097 257/40 |
| 2016/0336312 A1* | 11/2016 | Yan | ................ | H01L 21/28291 |

OTHER PUBLICATIONS

Lee, "Ferroelectricity of HfZrO2 in Energy Landscape With Surface Potential Gain for Low-Power Steep-Slope Transistors", May 20, 2015.

Khan, "Ferroelectric Negative Capacitance MOSFET: Capacitance Tuning & Antiferroelectric Operation", Mar. 1, 2011.

Xing, Title of Invention: Oxide Semiconductor Transistor and Manufacturing Method Thereof, U.S. Appl. No. 15/253,896, filed Sep. 1, 2016.

* cited by examiner

SEMICONDUCTOR DEVICE HAVING A FERROELECTRIC MATERIAL LAYER

CROSS REFERENCE TO RELATED APPLICATION

This application claims priority from Taiwan Patent Application Ser. No. 106118821 filed Jun. 7, 2017, which is included in its entirety herein by reference.

BACKGROUND OF THE INVENTION

1. Field of the Invention

The present invention relates generally to the field of semiconductor technology. More particularly, the present invention relates to an oxide-semiconductor field effect transistor (OSFET) device.

2. Description of the Prior Art

It is known that oxide semiconductor field effect transistor (OSFET) devices are often used in display devices as a thin film transistor driving element, or can be applied to the semiconductor field as a low power element or a memory element.

In order to achieve an ultra-low leakage current of the OSFET semiconductor device, typically, the threshold voltage (Vt) of the OSFET semiconductor device is increased, for example, by applying a negative voltage $V_{BG}$ to the back gate. It is required that the absolute value of $V_{BG}$ is greater than the gate voltage $V_{GE}$ ($V_{GE}$ is normally positive voltage) applied to the gate of the OSFET semiconductor device.

However, this approach requires the design of additional negative charge pump, which occupy a lot of chip area.

SUMMARY OF THE INVENTION

It is one object of the invention to provide an improved oxide-semiconductor field effect transistor (OSFET) device in order to solve the prior art problems or shortcomings.

One embodiment of the invention discloses a semiconductor device including a substrate, a source region and a drain region, a gate dielectric layer, and a ferroelectric material layer. The ferroelectric material layer overlaps with the source region and overlaps with the drain region. The substrate further comprises a channel layer. A gate electrode is disposed on the substrate. The ferroelectric material layer is disposed between the channel layer and the gate electrode.

The channel layer comprises an oxide semiconductor. The oxide semiconductor material comprises c-IGZO, a-IGZO, or CAAC-IGZO.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
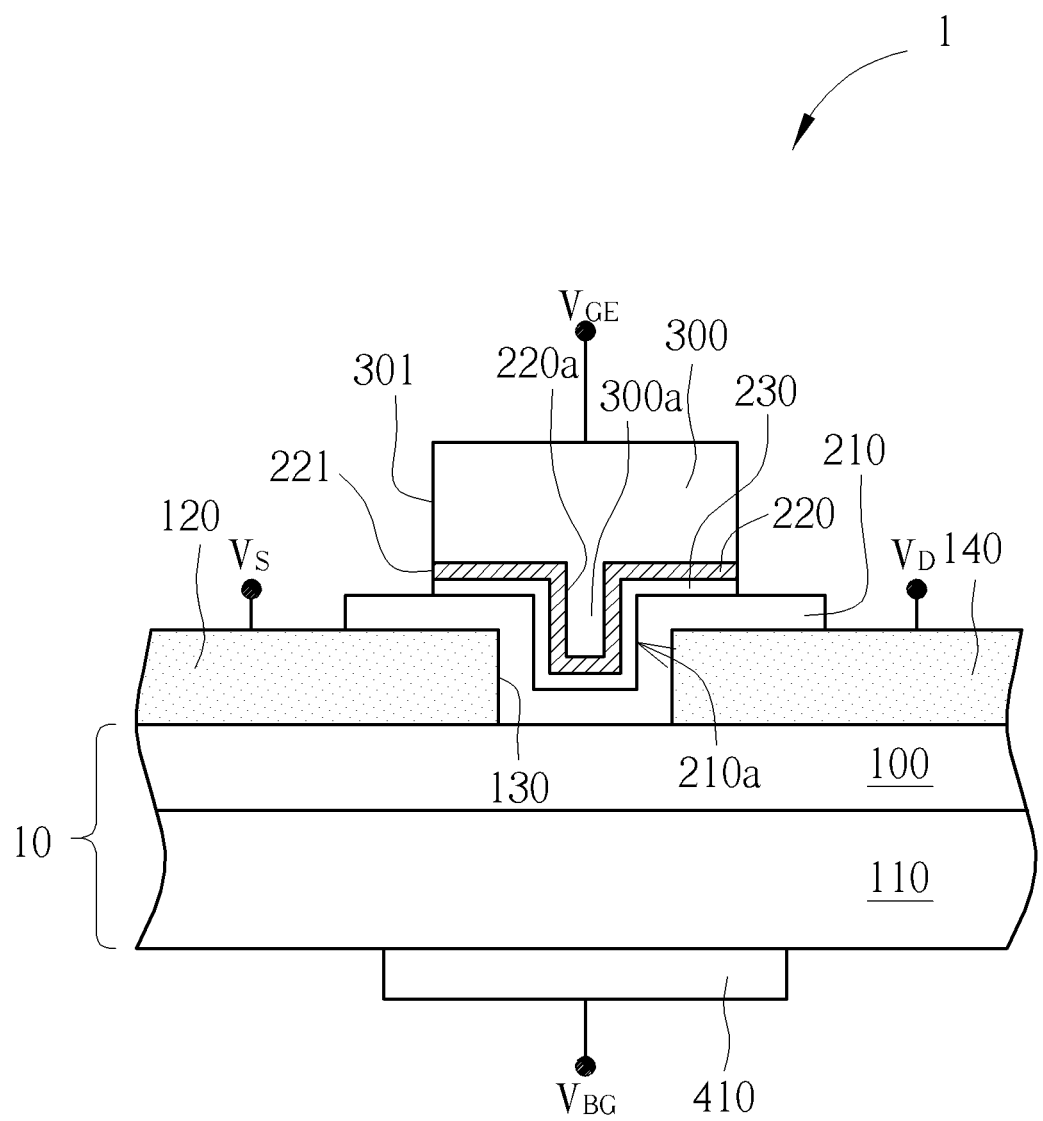
FIG. 1 is a schematic, cross-sectional diagram showing a semiconductor device according to one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

FIG. 1 is a schematic, cross-sectional diagram showing a semiconductor device according to one embodiment of the invention. As shown in FIG. 1, the semiconductor device 1 comprises a substrate 10, such as a semiconductor substrate. According to one embodiment, the substrate 10 comprises a channel layer 100 and a back-gate oxide layer 110 that is in direct contact with the channel layer 100. According to one embodiment, the channel layer 100 comprises an oxide semiconductor material, for example, c-IGZO, a-IGZO (amorphous IGZO), or CAAC-IGZO (c-axis aligned crystalline IGZO), but is not limited thereto. According to one embodiment, the channel layer 100 may be a single layered or multiple-layered structure.

According to one embodiment, a source region 120 and a drain region 140 are disposed on the channel layer 100. According to one embodiment, the source region 120 and the drain region 140 may be formed by using a deposition process and a subsequent patterning process. For example, the deposition process may comprise a physical vapor deposition (PVD) process or metal organic chemical vapor deposition (MOCVD) process. The patterning process may comprise a photolithographic process and an etching process.

According to one embodiment, the source region 120 and the drain region 140 may comprise a single layer of metal or a metal stack having multiple metal layers. For example, the source region 120 and the drain region 140 may include a stacked structure of copper and a copper alloy or a stacked structure of copper and molybdenum, but is not limited thereto. In other embodiments, the source region 120 and the drain region 140 may comprise a transparent conductive material, such as indium tin oxide (ITO), or the like.

According to an embodiment of the present invention, a gap 130 is provided between the source region 120 and the drain region 140. The source region 120 and the drain region 140 are spaced from each other by the gap 130 without contacting each other.

According to an embodiment of the present invention, the semiconductor device 1 further comprises a gate dielectric layer 210. The gate dielectric layer 210 conforms to the inner surface of the gap 130, and in the gap 130, the gate dielectric layer 210 is in direct contact with the channel layer 100. According to an embodiment of the present invention, the gate dielectric layer 210 may include a silicon oxide layer, a nitrogen-containing silicon oxide layer, or a high dielectric constant material.

According to an embodiment of the present invention, the semiconductor device 1 further comprises a ferroelectric material layer 220. The ferroelectric material layer 220 partially overlaps with the source region 120 and partially overlaps with the drain region 240. According to an embodiment of the present invention, the ferroelectric material layer may comprise $HfZrO_x$, $BaTiO_3$, $PbTiO_3$, $PbZr_xTiO_3$, $KNbO_3$, $LiNbO_3$, $LiTaO_3$, $Sr_{1-x}Ba_xNb_2O_6$, $Ba_{0.8}Na_{0.4}Nb_2O_6$, or other suitable materials. According to an embodiment of the present invention, the ferroelectric material layer 220 conformally covers a recessed top surface 210a of the gate dielectric layer 210 in the gap 130.

According to an embodiment of the present invention, the semiconductor device 1 further comprises agate electrode 300 disposed on the substrate 10. According to an embodiment of the present invention, the ferroelectric material layer 220 is disposed between the channel layer 100 and the gate electrode 300. According to an embodiment of the present invention, the ferroelectric material layer 220 is disposed between the gate electrode 300 and the gate dielectric layer 210. According to an embodiment of the present invention, the gate electrode 300 completely fills up a recessed area 220a of the ferroelectric material layer 220 directly above the gap 130, thereby forming a gate protrusion 300a between the source region 120 and the drain region 140.

According to an embodiment of the present invention, the semiconductor device 1 further comprises an intermediate buffer layer 230 disposed between the gate dielectric layer 210 and the ferroelectric material layer 220. According to an embodiment of the present invention, the intermediate buffer layer 230 may comprise titanium nitride (TiN) or aluminum oxide ($Al_2O_3$). According to an embodiment of the present invention, the intermediate buffer layer 230 may comprise metal such as tungsten, titanium, or cobalt.

According to an embodiment of the present invention, the semiconductor device 1 further comprises a back-gate electrode 410 in direct contact with the back-gate oxide layer 110. In operation, the back-gate electrode 410 is applied with a back gate voltage $V_{BG}$ where $V_{BG}<0V$ and the absolute value of $V_{BG}$ is less than the gate voltage $V_{GE}$ applied to the gate electrode of the OSFET semiconductor device ($V_{GE}$ is usually positive voltage or $V_{GE}>0V$). In addition, during operation, the source region 120 is grounded (source voltage $V_s=0V$), and the drain region 140 is applied with a positive voltage (drain voltage $V_D>0V$).

In FIG. 1, the gate electrode 300 has a vertical gate edge 301 and the vertical gate edge 301 is aligned with an edge 221 of the ferroelectric material layer 220. In addition, the gate dielectric layer 210 in FIG. 1 protrudes beyond the vertical gate edge 301.

Figure 2:
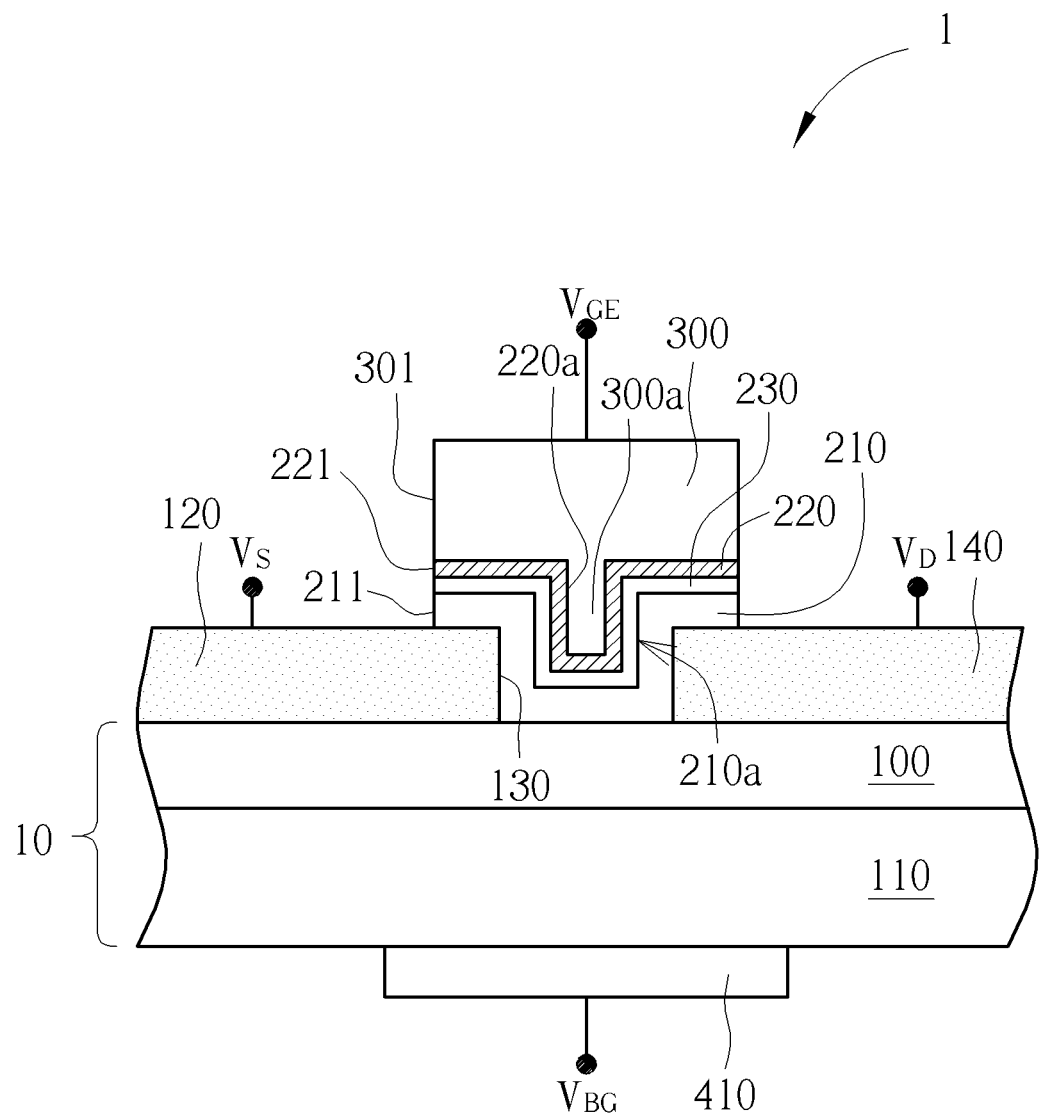
FIG. 2 is a schematic, cross-sectional diagram showing a semiconductor device according to another embodiment of the invention.

In another embodiment, the edge 211 of the gate dielectric layer 210 may be aligned with the vertical gate edge 301, as shown in FIG. 2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate comprising a channel layer, wherein the channel layer has a top surface;
   a source region and a drain region disposed on the top surface of the channel layer, wherein the source region is spaced apart from the drain region, thereby forming a gap between the source region and the drain region and above the channel layer, wherein the source region and the drain region comprise a metal layer;
   a gate electrode disposed on the substrate;
   a gate dielectric layer, wherein the gate dielectric layer is in direct contact with the channel layer within the gap; and
   a ferroelectric material layer, wherein the ferroelectric material layer overlaps with the source region and overlaps with the drain region.

2. The semiconductor device according to claim 1, wherein the ferroelectric material layer is disposed between the channel layer and the gate electrode, and wherein part of the ferroelectric material layer is disposed within the gap.

3. The semiconductor device according to claim 2, wherein part of the gate electrode is disposed within the gap.

4. The semiconductor device according to claim 1, wherein the ferroelectric material layer is disposed between the gate electrode and the gate dielectric layer.

5. The semiconductor device according to claim 1, wherein the channel layer comprises an oxide semiconductor material.

6. The semiconductor device according to claim 5, wherein the oxide semiconductor material comprises c-IGZO, a-IGZO, or CAAC-IGZO.

7. The semiconductor device according to claim 1, wherein the ferroelectric material layer partially overlaps with the source region and partially overlaps with the drain region.

8. The semiconductor device according to claim 1, wherein the gate dielectric layer conformally covers an interior surface of the gap.

9. The semiconductor device according to claim 8, wherein the ferroelectric material layer conformally covers a recessed top surface of the gate dielectric layer in the gap.

10. The semiconductor device according to claim 9, wherein the gate electrode completely fills up a recessed area of the ferroelectric material layer directly above the gap, thereby forming a gate protrusion between the source region and the drain region.

11. The semiconductor device according to claim 1 further comprising an intermediate buffer layer disposed between the gate dielectric layer and the ferroelectric material layer.

12. The semiconductor device according to claim 11, wherein the intermediate buffer layer comprises titanium nitride or aluminum oxide.

13. The semiconductor device according to claim 1, wherein the substrate further comprises a back-gate oxide layer that is in direct contact with the channel layer.

14. The semiconductor device according to claim 13 further comprising a back-gate electrode in direct contact with the back-gate oxide layer.

15. The semiconductor device according to claim 1, wherein the ferroelectric material layer comprises $HfZrO_x$, $BaTiO_3$, $PbTiO_3$, $PbZr_xTiO_3$, $KNbO_3$, $LiNbO_3$, $LiTaO_3$, $Sr_{1-x}Ba_xNb_2O_6$, $Ba_{0.8}Na_{0.4}Nb_2O_6$.

* * * * *